United States Patent [19]
Cline

[11] Patent Number: 5,332,944
[45] Date of Patent: Jul. 26, 1994

[54] ENVIRONMENTALLY SEALED PIEZOELECTRIC SWITCH ASSEMBLY

[76] Inventor: David J. Cline, 5471 Sorrento Dr., Long Beach, Calif. 90803

[21] Appl. No.: 133,653

[22] Filed: Oct. 6, 1993

[51] Int. Cl.⁵ .......................................... H01L 41/08
[52] U.S. Cl. .................... 310/339; 200/181; 310/340
[58] Field of Search ............... 310/338, 339, 340, 345, 310/330, 332, 324; 200/181

[56] References Cited

U.S. PATENT DOCUMENTS

| | | | |
|---|---|---|---|
| 2,587,304 | 2/1952 | Fiske, Jr. et al. | 171/327 |
| 3,206,647 | 9/1965 | Kahn | 317/101 |
| 3,210,701 | 10/1965 | Fastner et al. | 336/96 |
| 3,239,696 | 3/1966 | Burkhalter et al. | 310/339 X |
| 3,307,052 | 2/1967 | Neilson et al. | 310/339 |
| 3,387,149 | 6/1968 | Young | 310/345 X |
| 3,484,536 | 12/1969 | Jaeschke et al. | 174/52 |
| 3,564,303 | 2/1971 | Geil | 310/339 |
| 3,659,615 | 5/1972 | Enger | 128/419 P |
| 3,763,464 | 10/1973 | Laurent | 340/10 |
| 3,935,485 | 1/1976 | Yoshida et al. | 310/339 |
| 3,965,065 | 6/1976 | Elliott | 260/39 FB |
| 4,079,511 | 3/1978 | Grabbe | 29/627 |
| 4,092,487 | 5/1978 | Imai | 174/52 PE |
| 4,190,785 | 2/1980 | Kompanek | 310/339 |
| 4,250,347 | 2/1981 | Fierkens | 174/52 PE |
| 4,327,369 | 4/1982 | Kaplan | 357/72 |
| 4,330,637 | 5/1982 | Wong | 524/720 |
| 4,396,796 | 8/1983 | Wong | 174/52 PE |
| 4,521,712 | 6/1985 | Braun et al. | 310/339 |
| 4,618,797 | 10/1986 | Cline | 310/339 |
| 5,142,183 | 8/1992 | Burgess et al. | 310/339 |
| 5,231,326 | 7/1993 | Echols | 310/339 |

*Primary Examiner*—Mark O. Budd
*Attorney, Agent, or Firm*—J. F. McLellan

[57] ABSTRACT

An electrical switch assembly for use in a warm, humid environment to initiate operation of electrical equipment such as hot tub or spa pumps, blowers and heaters. The assembly includes a hollow enclosure having an access opening. An actuator extends through and is movable within the access opening. A rigid circuit board fixed in position within the enclosure supports a piezoelectric subassembly which is deformable by the actuator to generate an electrical signal. Resiliently deformable potting material fills all the open spaces around the circuit board, the piezoelectric subassembly and the actuator. The potting material prevents moisture intrusion but is resiliently deformable to allow operational movement of the piezoelectric subassembly and the actuator.

9 Claims, 1 Drawing Sheet

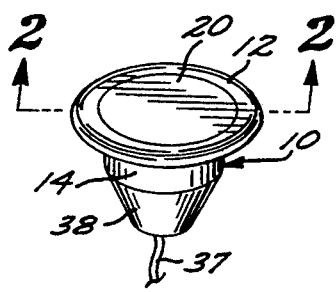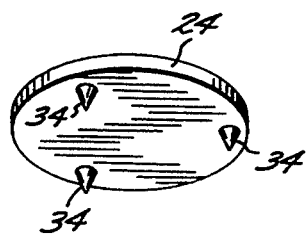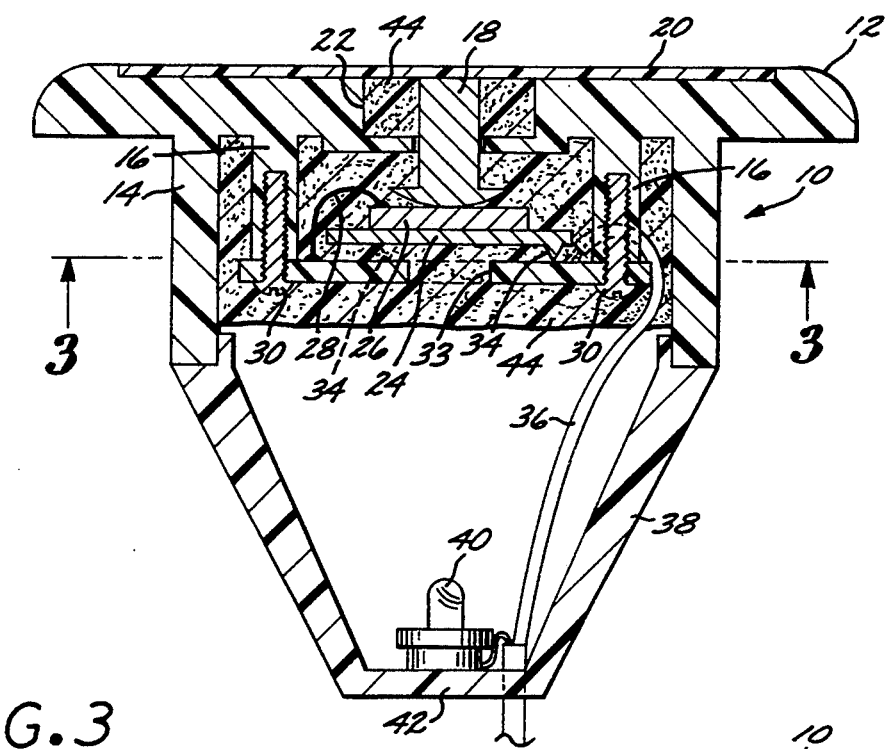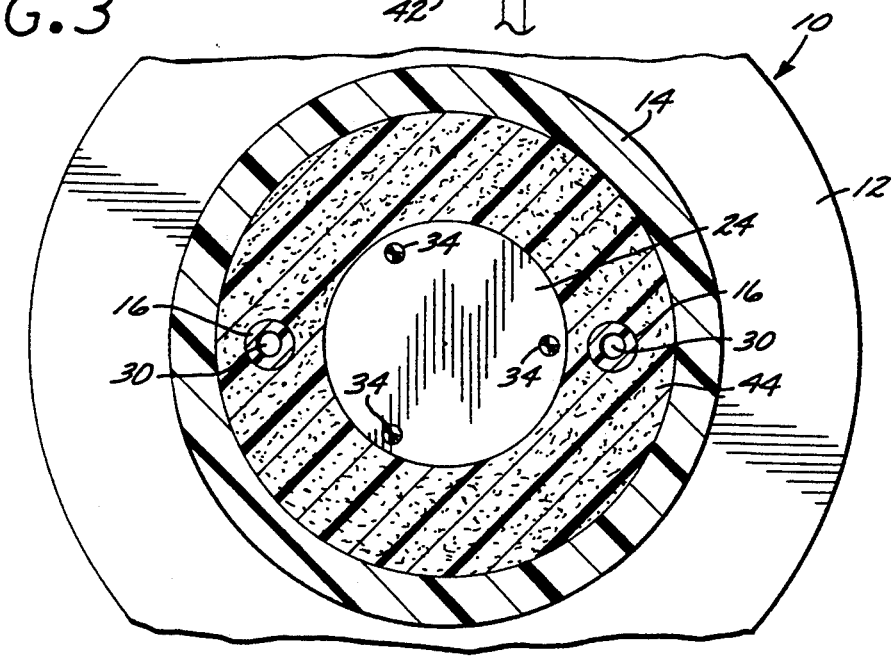

ENVIRONMENTALLY SEALED PIEZOELECTRIC SWITCH ASSEMBLY

BACKGROUND OF THE INVENTION

1. Field of the Invention

The present invention relates generally to a sealed electrical switch assembly, and more particularly to an electrical switch assembly fixed within an enclosure, and completely encapsulated by a waterproof compound that is resiliently flowable to enable relative movement between certain components of the switch assembly.

2. Description of the Prior Art

The switches that operate remotely located hot tub or spa heaters, pumps and blowers are preferably located next to the spa for convenient use. However, electronic components located in warm, humid environments such as that around a spa are susceptible to moisture penetration and consequent malfunction. Location of potentially malfunctioning switches where they could be operated by persons in the spa would present an unacceptable risk of electrical shock. Air switches have been used to avoid this, but there are certain disadvantages in using them.

The switch components could be encapsulated in a rigid waterproof potting compound to seal them from the humid spa environment. U.S. Pat. No. 4,268,713, issued May 19, 1981 to Donley et al, is typical of devices that encapsulate components in a waterproof compound to protect them from moisture. A flasher is disclosed having a cavity in which electrical components are located. The cavity is filled with a rigid potting compound to completely seal the components from the environment. However, mechanical switch contacts that must move to function could not be protected by such a compound because the compound would prevent such movement.

Various other methods have been advanced in the prior art to provide moisture protection. The majority involve placement of the switch in a waterproof housing, and then sealing any access openings to the outside with rubber boots, O-rings, gaskets and the like. Unfortunately, in many instances this does not provide complete moisture proofing, and in most other instances such sealing measures fail after a relatively short service life.

The system of my U.S. Pat. No. 4,618,797, issued Oct. 21, 1986, overcomes the deficiencies of the prior art by employing a piezoelectric element that can be flexed to generate the desired signal. The element is located in an enclosure filled with a potting material. The material hermetically seals the element, yet is resiliently deformable to allow the element to flex. The system of the patent has operated successfully, but the manufacture, location and placement of the components has presented certain difficulties.

More particularly, the interior of the enclosure structure had to be specially configured to support the element in the potting material, and to provide a flow port below the element for the material to flow away from that area when the element was downwardly deformed or flexed. The system circuit board was located below and separately of the element, and was supported only by the potting material.

This arrangement required individual placement of the element and the circuit board in proper positions within the enclosure before the enclosure was filled with the potting material. Also, only a spacer and a thin plastic overlay separated the element from the environment. Modification of the system appeared necessary because it was theorized that over a long period of time moisture might possibly migrate to the piezoelectric element along the faying surfaces of the overlay, the enclosure, and the spacer, and then adversely affect operation of the element.

SUMMARY OF THE INVENTION

According to the present invention, an electrical switch assembly is provided which includes piezoelectric means located within an enclosure and adapted to generate an electrical signal upon being flexed or deformed. The structure of the enclosure includes internally extending posts or standoffs to which the system circuit board is attached. The board is sufficiently rigid that it can support the element during its operation. Point contacts extend downwardly from the piezoelectric means into engagement with the board, thereby allowing flexing or deforming of the midportion of the piezoelectric means. The board includes a flow port to allow potting material within the enclosure to flow from the space between the board and the midportion of the means so that the piezoelectric means can flex.

The means and the board are located relatively deep within the enclosure, with the means being deformed or flexed by pushing against an elongated actuator underlying a plastic sheet or overlay on the enclosure. The interior end of the actuator is in contact with the means, while its upper end is surrounded by a recess or annular space adjacent the enclosure overlay. Potting material fills all spaces around the piezoelectric means, the circuit board and the actuator.

The arrangement is easy to assembly in that the piezoelectric means and the associated circuitry are all part of a single sub assembly carried by the circuit board. The circuit board does not have to be positioned in the potting material separately of the means, and the means are supported by the board rather than by a specially configured enclosure. Moreover, there is a much reduced potential for moisture leakage and shock hazard since all electrical components are electrically isolated from the environment and the spa user by the overlay, the actuator and a greater amount of potting material between the components and the environment.

Various portions of the assembly can be made light conductive, including the actuator, and a light can be located adjacent the enclosure interior. This enables the actuator to illuminate the adjacent portion of the overlay so that a user can quickly find and operate the switch assembly in the dark.

Other aspects and advantages of the present invention will become apparent from the following more detailed description taken in conjunction with the accompanying drawings.

BRIEF DESCRIPTION OF THE DRAWINGS

FIG. 1 is a perspective view of an electrical switch assembly according to the present invention;

FIG. 2 is an enlarged view taken along the line 2—2 of FIG. 1;

FIG. 3 is a partial view taken along the line 3—3 of FIG. 2; and

FIG. 4 is a perspective view of the underside of a component of the piezoelectric means.

DESCRIPTION OF A PREFERRED EMBODIMENT

As previously indicated, the system of my U.S. Pat. No. 4,618,797 provided a feasible way to protect a mechanically movable switch element from the corrosive effects of an adverse environment, such as the warm and humid air found in the vicinity of a hot tub or spa. This was done by utilizing a piezoelectric crystal element protected by a potting material that permitted enough flexure of the element to generate a switching output signal in response to external mechanical pressure applied by a user. As will be seen, the present invention accomplishes a similar result but, among other things, employs an improved arrangement and location of the elements of the switch assembly.

Referring now to the drawings, the electrical switch assembly according to the present invention comprises, generally, a housing or enclosure 10 open at the bottom and molded of a suitable rigid or inelastic, electrically non-conductive plastic material. The enclosure includes a circular top 12 and a reduced diameter cylindrical wall 14 which extends downwardly to define an internal space or cavity.

A pair of posts or standoffs 16 are integral with and extend downwardly of the top 12, that is, they extend inwardly toward the enclosure cavity. The term "downwardly" is synonymous with "inwardly" because of the usual vertical orientation of the switch assembly in use. It will be understood that this and like directional terms are merely used for convenience and are intended to include equivalent directions in the event the switch is oriented horizontally or otherwise.

A central, vertically oriented actuator or access opening is formed in the top 12 to receive the upper end of the shank of an elongated actuator 18. The actuator is preferably made of clear, electrically non-conductive plastic material.

A shallow circular recess is provided in the top 12 coaxial with the actuator opening, and a thin flexible touch panel or overlay 20 approximately 0.1 millimeters thick is fused within the recess using heat, pressure and a suitable adhesive. The overlay is preferably made of light transmitting polycarbonate material, such as that marketed under the trademark Mylar.

The overlay 20 serves as the initial moisture barrier and, although not shown, it is provided with indicia to identify the function of the switch assembly. For example, the overlay might be marked "PUMP" to indicate that pressing upon the overlay in that region will be effective to operate a remotely located spa pump (not shown).

The top 12 is also provided with an annular recess 22 lying below the plane of the overlay recess, and coaxial with the actuator opening so that the actuator extends through the annular recess where it can be moved downwardly upon depression of the overlay 20 in that region.

The lower end of the actuator 18 is convex. Its generally mushroom shaped surface is engaged upon the upper surface of a sensor, transducer or piezoelectric disk or element 26 which forms a part of the present piezoelectric means. The element 26 may be approximately 0.05 millimeters thick and approximately 17 millimeters in diameter.

The lower surface of the element 26 is coextensively attached or adhered to the upper surface of a flexible circular member 24 which also forms part of the piezoelectric switch means. The member 24 is slightly larger in diameter compared to the element 26 and preferably is made of electrically conductive thin sheet metal material. Copper sheet approximately 0.05 millimeters in thickness has operated satisfactorily, although stainless steel or comparable electrically conductive materials would also be suitable so long as they are characterized by the desired flexure or capability for resilient deformation.

A suitable adhesive (not shown) for attaching the member 24 to the element 26 is epoxy or the like (not shown) which is sufficiently thin to be electrically non-resistive or transparent.

As is well known, when the piezoelectric element 26 is subjected to an external pressure or force sufficient to bend or deform it, it is operative to generate a corresponding electrical output pulse or signal in response to that pressure or force.

The output signal is carried by electrical conductor means, including a conductor 28, to a circuit board 30. One end of the conductor 28 is connected to the upper surface of the element 26, and the other end is coupled to electrical circuitry (not shown) located on the upper surface of the board 30.

The circuit board is merely representative of any electrical circuitry which may be associated with the element 26. Typically it would be a circuit for amplifying the output voltage from the element 26 and member 24, and would be operative to control lights, pumps, blowers, heaters or the like in a hot tub or spa application, for example.

The circuit board 30 is structurally relatively rigid. It extends between the two standoffs 16 below the element 26, and its opposite ends are attached to the standoffs 16 by suitable fasteners such as headed bolts 32 threaded into openings in the standoffs 16. The board 30 is provided with a central flow opening 33 which is generally aligned with the actuator or access opening in the enclosure top 12.

The flexible member 24 to which the piezoelectric element 26 is attached is characterized by integral, interiorly extending legs or contact points 34 which rest upon the circuit board circuitry to provide a ground connection. In addition, the points 34 space the midportion of the member 24 above the circuit board to define a flexure space. The space is very slight to allow flexure of the member 24 and element 26, while yet having the member 24 engage or "bottom" against the circuit board 30 if too much force is exerted against the element 26 by the person pushing upon the actuator 18.

Using components having the dimensions described above has been found to enable a central deflection of the element 26 and member 24 of approximately 0.02 millimeters, which has been found to be sufficient to generate an appropriate electrical signal.

Electrical conductors 36 are connected to the circuitry of the circuit board 30, and extend downwardly from the board and out of the cavity defined by the enclosure 10. They further extend into a hollow space defined by a conical light box 38. The upwardly open end of the box 38 is peripherally flanged to closely fit against the lower terminus of the enclosure wall 14, and it is secured in that position by any suitable means, such as by a moisture proof adhesive (not shown).

A light 40 is mounted within the box 38 on its base 42. The wiring for the light is bundled with the conductors 36 within a cable 37 which passes through an opening in the base 42. As will be apparent, the cable 37 is connected to a suitable power source and to the particular apparatus which the switch assembly is intended to operate. Suitable waterproofing material (not shown) can be disposed about the cable 37 where it passes through the base.

Operation of the light illuminates the interior of the light box 38, whose wall are preferably made reflective so that light is conducted upwardly through the potting material 44 to the light conductive actuator 18. The actuator in turn illuminates the adjacent area of the overlay 20 that the user must press in order to operate the switch assembly.

The potting material 44 is resiliently deformable and selection of the proper material is important to the present invention. The material must be resistant to whatever hostile chemicals will be encountered in the operating environment, and it must be sufficiently elastic or resiliently deformable to permit deflection of the member 24 and the element 26, and also return to its previous undeformed state once external pressure on the actuator 18 is removed. A silicone dielectric gel, marketed by Dow Corning as Q3-6527 A and B, has been found to give good results. It is a high dielectric substance and is totally hydrophobic, that is, water cannot penetrate it.

By proper selection of an appropriate dielectric potting material 44 and overlay 20, the member 24, element 26 and the circuit board 32 making up the vulnerable components of the switch assembly can be made resistant to almost any chemical or other substance, although resistance to the heated, humid environment around a spa is particularly important for the embodiment described above.

The potting material 44 is initially poured in a liquid state into the cavity and spaces defined within the enclosure 10, with the enclosure in an inverted state and upwardly open. This allows the material 44 to fill all portions of the enclosure cavity and the recess 22, and also any spaces between the components underlying the overlay 20, or existing around the conductors 28 and 36 within the enclosure cavity. In particular, pouring of the material 44 is continued until the circuit board 32 and all components on or associated with the circuit board are completely encapsulated. Only electrical conductors 36 extend out of the potting material. Filling of all voids can be facilitated by placing the filled enclosure 10 in a vacuum chamber, with the potting material 44 in an as yet uncured state. A vacuum is developed to remove air, and subsequent backfilling or admission of air then drives the potting material into any voids that exist.

The cable containing the conductors 36 and the electrical lead for the light 40 is then disposed through the opening in the base 42 of the light box 38. Waterproofing material (not shown) is placed in the opening adjacent the cable, and the box 38 is then fitted to the enclosure 10 and fixedly adhered in position to hermetically seal the interior of the enclosure and the light box.

Although only one switch assembly has been illustrated and described, it will be apparent that similar switch assemblies can all be incorporated in a control panel (not shown) for operating individual pumps, blowers, heaters or the like.

In operation, the switching assembly is actuable by manual depression of the overlay 20 in the region overlying the actuator 18. This downwardly moves the actuator and downwardly deflects the piezoelectric element 26 and the flexible member 24. The adjacent potting material 44 is displaced by resilient deformation or partial "flowing" out of the flexure space between the member 24 and the circuit board. Flow also occurs through the flow opening 33 in the circuit board 32. The degree of deformation or flow is very small, but it is sufficient to permit the desired mechanical flexure of the member 24 and element 26.

Upon release of manual pressure upon the overlay in the region of the actuator, the actuator 18, member 24 and element 26 return to their undeflected or previous state by virtue of the resilience of the member 24 and the element 26, aided by the elasticity or resilience of the potting material 44, which tends to flow back to its original location.

The deep location of the member 24, element 26 and circuit board 32 within the enclosure 10 provides greater electrical isolation of these components from the user, particularly by virtue of the significant mass of electrical insulating potting material 44 located between these components and the overlay 20.

Although a specific embodiment of the invention has been described and illustrated, it will be understood that the invention is not to be limited to the specific forms or arrangement of parts described and illustrated, and that various changes can be made within the scope of the appended claims.

I claim:

1. An electrical switch assembly comprising:
   enclosure means defining a cavity, and including an access opening;
   circuit board means fixed to the enclosure means within the cavity, and including an opening generally aligned with the access opening in the enclosure means;
   piezoelectric means overlying the circuit board means in spaced relationship to define a flexure space, the piezoelectric means having interiorly extending contact elements engaged upon the circuit board means around the opening in the circuit board means, the piezoelectric means being characterized on deformation by generation of an electrical signal;
   first electrical conductor means coupled between the piezoelectric means and the circuit board means;
   second electrical conductor means coupled to the circuit board means and extending into the cavity for carrying a signal to the exterior of the enclosure means;
   an actuating element extending through the access opening in the enclosure means and interiorly movable for deforming the piezoelectric means; and
   resiliently deformable potting means filling the cavity, the flexure space, and the openings in the enclosure means and the circuit board means to block entry of moisture into the flexure space, the cavity and the openings, the resilient deformability of the potting means enabling flexure of the piezoelectric means for generating the signal.

2. An electrical switch assembly according to claim 1 wherein the piezoelectric means comprises a flexible electrically conductive member located adjacent to the circuit board means and carrying the contact elements.

3. An electrical switch assembly according to claim 1 wherein the circuit board means is engagable by the central portion of the flexible member for limiting the amount of the flexure.

4. An electrical switch assembly according to claim 1 and further comprising a flexible, manually depressible overlay, and wherein the actuating element is elongated and characterized by an interior extremity engaged upon the piezoelectric means, and by an exterior extremity engaged by the overlay, and wherein the enclosure means includes a recess surrounding the upper extremity, and wherein the potting means fills the recess.

5. An electrical switch assembly according to claim 1 wherein the actuating element is elongated and characterized by an interior extremity engaged upon the piezoelectric means, and by an exterior extremity located within the access opening in the enclosure means, and further comprising a light box attached to the enclosure means and a light mounted in the light box, and wherein the potting means and the actuating element are light conductive to transmit light from the light box to the exterior extremity of the actuating element.

6. An electrical switch assembly comprising:
enclosure means defining a cavity, and including an exteriorly located circular opening, and interiorly extending standoff means;
rigid circuit board means attached to the standoff means and including a circular opening generally aligned with the circular opening in the enclosure means and providing a flow passage through the circuit board;
a flexible, electrically conductive member overlying the circuit board means in spaced relationship to define a flexure space, the member spanning the opening in the circuit board means and having a generally planar exteriorly located surface and an interiorly located surface having interiorly extending contact elements engaged upon the circuit board means;
a piezoelectric element having a generally planar interiorly located surface adhered to the exteriorly located surface of the flexible member and characterized on deformation by generation of an electrical signal;
electrical conductor means coupled to the piezoelectric element and to the circuit board means for carrying the signal to the exterior of the enclosure means;
an actuating element extending through the opening in the enclosure means and interiorly movable for deforming the piezoelectric element; and
resiliently deformable potting means filling the cavity, the flexure space, and the openings in the enclosure means and in the circuit board means to block entry of moisture into the flexure space, the cavity and the openings, the resilient deformability of the potting means enabling flexure of the flexible member and the piezoelectric element upon application of external pressure upon the flexible member and the piezoelectric element, the deformational flow being oppositely directed upon removal of such external pressure.

7. An electrical switch assembly according to claim 6 wherein the potting means is a silicone dielectric gel.

8. An electrical switch assembly according to claim 6 wherein the flexible member comprises a relatively thin element made of electrically conductive metal.

9. An electrical switch assembly comprising:
a hollow enclosure having an opening;
an actuating element extending through and movable within the opening in the enclosure;
relatively rigid circuit board means located in and rigidly supported by the enclosure, and having an opening generally aligned with the opening in the enclosure;
piezoelectric means in the enclosure engaged upon and supported by the circuit board means, and positioned for engagement by the actuating element and deformation relative to the rigid circuit board means, thereby to generate an electrical signal for transmission to the circuit board means; and
resiliently deformable potting means filling all open spaces which are located within the enclosure adjacent the circuit board means, the piezoelectric means and the actuating element, whereby the potting means prevents moisture intrusion into such spaces, and whereby the resilient deformability of the potting means enables deformational flow of the potting means sufficient to permit movement of the actuating element and the piezoelectric means.

* * * * *